(12) United States Patent
Xue et al.

(10) Patent No.: US 11,584,139 B2
(45) Date of Patent: Feb. 21, 2023

(54) PRINTING APPARATUS AND PRINTING METHOD

(71) Applicant: BOE TECHNOLOGY GROUP CO., LTD., Beijing (CN)

(72) Inventors: Jinxiang Xue, Beijing (CN); Zhongyuan Sun, Beijing (CN); Xiang Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1261 days.

(21) Appl. No.: 16/069,090

(22) PCT Filed: Sep. 28, 2017

(86) PCT No.: PCT/CN2017/103909
§ 371 (c)(1),
(2) Date: Jul. 10, 2018

(87) PCT Pub. No.: WO2018/161546
PCT Pub. Date: Sep. 13, 2018

(65) Prior Publication Data
US 2022/0169032 A1 Jun. 2, 2022

(30) Foreign Application Priority Data
Mar. 9, 2017 (CN) .......................... 201710136857.X

(51) Int. Cl.
| | | |
|---|---|---|
| *B05B 7/00* | (2006.01) | |
| *B41J 2/175* | (2006.01) | |
| *B05B 12/18* | (2018.01) | |
| *B05B 7/24* | (2006.01) | |

(52) U.S. Cl.
CPC .......... *B41J 2/17596* (2013.01); *B05B 7/2489* (2013.01); *B05B 12/18* (2018.02)

(58) Field of Classification Search
CPC ...... B41J 2/17596; B05B 12/18; B05B 7/2489
USPC .......................................................... 118/300
See application file for complete search history.

(56) References Cited

U.S. PATENT DOCUMENTS

| | | | |
|---|---|---|---|
| 3,674,213 A | 7/1972 | Le Mounier | |
| 7,101,440 B2 | 9/2006 | Nakamura et al. | |
| 2003/0151637 A1 | 8/2003 | Nakamura et al. | |
| 2006/0164484 A1* | 7/2006 | Tanaka | B41J 2/17513 347/100 |

(Continued)

FOREIGN PATENT DOCUMENTS

| | | |
|---|---|---|
| CN | 86203909 U | 12/1986 |
| CN | 2078199 U | 6/1991 |

(Continued)

OTHER PUBLICATIONS

Fourth Office Action for Chinese Patent Application No. 201710136857.X dated Oct. 18, 2019.

(Continued)

*Primary Examiner* — Davis D Hwu
(74) *Attorney, Agent, or Firm* — Calfee, Halter & Griswold LLP

(57) ABSTRACT

A printing apparatus includes a carrying platform on which a substrate is placed, a cartridge configured to store and supply ink, and a print head configured to atomize the ink into ink droplets and deposit the ink droplets on a printing region of the substrate.

18 Claims, 3 Drawing Sheets

(56) References Cited

U.S. PATENT DOCUMENTS

| | | | |
|---|---|---|---|
| 2006/0250077 | A1 | 11/2006 | Nakamura et al. |
| 2006/0250445 | A1 | 11/2006 | Nakamura et al. |
| 2006/0251804 | A1 | 11/2006 | Nakamura et al. |
| 2008/0092773 | A1* | 4/2008 | Matsuyama ......... C09D 11/322 347/100 |
| 2008/0210944 | A1 | 9/2008 | Nakamura et al. |
| 2009/0237449 | A1 | 9/2009 | Silverbrook |
| 2011/0008541 | A1 | 1/2011 | Madigan et al. |
| 2011/0059230 | A1 | 3/2011 | Hoerteis et al. |
| 2014/0035995 | A1 | 2/2014 | Chou et al. |
| 2014/0331932 | A1 | 11/2014 | Madigan et al. |

FOREIGN PATENT DOCUMENTS

| | | | |
|---|---|---|---|
| CN | 1196117 | A | 10/1998 |
| CN | 1320485 | A | 11/2001 |
| CN | 1422746 | A | 6/2003 |
| CN | 1434770 | A | 8/2003 |
| CN | 1507374 | A | 6/2004 |
| CN | 15074734 | A | 6/2004 |
| CN | 101919063 | A | 12/2010 |
| CN | 102085752 | A | 6/2011 |
| CN | 102414863 | A | 4/2012 |
| CN | 102971080 | A | 3/2013 |
| CN | 103009812 | A | 4/2013 |
| CN | 103521368 | A | 1/2014 |
| CN | 104324839 | A | 2/2015 |
| CN | 204620287 | U | 9/2015 |
| CN | 204925548 | A | 12/2015 |
| CN | 204925548 | U | 12/2015 |
| CN | 106274055 | A | 1/2017 |
| CN | 106903996 | A | 6/2017 |
| EP | 2218106 | A2 | 8/2010 |
| EP | 2425470 | A2 | 3/2012 |
| EP | 2649141 | A2 | 10/2013 |
| JP | 02097090 | A | 4/1990 |
| JP | 2007021328 | A | 2/2007 |
| WO | 2010127328 | A2 | 11/2010 |
| WO | 2012078820 | A2 | 6/2012 |
| WO | 2014197027 | A2 | 12/2014 |

OTHER PUBLICATIONS

Search Report and Written Opinion for International Application No. PCT/CN2017/103909 dated Dec. 29, 2017.
First Office Action for Chinese Patent Application No. 201710136857.X dated Dec. 4, 2017.
Second Office Action for Chinese Patent Application No. 201710136857.X dated Jul. 17, 2018.
Decision of Rejection for Chinese Patent Application No. 201710136857.x dated Jun. 5, 2019.
Third Office Action for Chinese Patent Application No. 201710136857.X dated Feb. 1, 2019.

* cited by examiner

PRINTING APPARATUS AND PRINTING METHOD

CROSS-REFERENCE TO RELATED APPLICATIONS

The present application is based on International Application No. PCT/CN2017/103909, filed on Sep. 28, 2017, which is based upon and claims priority to Chinese Patent Application No. 201710136857.X, filed on Mar. 9, 2017, and the entire contents thereof are incorporated herein by reference.

TECHNICAL FIELD

The present disclosure relates to the technical field of printing, in particular to a printing apparatus and a printing method.

BACKGROUND

In recent years, with the increasing demand from the market, flexible OLED display is becoming an important development direction for the display industry. The quality of the packaging technique for OLED determines lift span of products. The three-stacked-layer structure (CVD (chemical vapor deposition)-Flatness-CVD) becomes a currently predominant way to package due to its excellent performance. The flatness layer of the three-stacked-layer structure is mainly accomplished by inkjet printing and curing. Currently, the inkjet printing mainly uses ceramic piezoelectric print heads which draw ink under the drawing state and eject ink under the releasing state by the control of pulse voltages. The ejected ink is dropped on the substrate and the ink droplets each spread and are connected with each other. The ink as a whole flows level and is cured. The ink droplets ejected by the existing print heads have relatively large volume. Take an example of an ink droplet of 10 PL, from the calculation formula for sphere volume $V=(4/3)\pi R3$ it can be obtained that the ink droplet has a diameter of 27 μm. Large size may increase reliance on leveling property, usually cause generation of void and the like, and have limitation to usage. Accordingly, such print heads are expensive.

It should be noted that, information disclosed in the above background portion is provided only for better understanding of the background of the present disclosure, and thus it may contain information that does not form the prior art known by those ordinary skilled in the art.

SUMMARY

The disclosure provides a printing apparatus comprising a carrying platform on which a substrate is placed, a cartridge configured to store and supply ink, and a print head configured to atomize the ink into ink droplets and deposit the ink droplets on a printing region of the substrate.

In some embodiments, the ink droplets have a diameter of 0.5-10 μm.

In some embodiments, the print head comprises at least one atomizing nozzle and at least one high pressure gas outlet provided around the atomizing nozzle.

In some embodiments, the print head further comprises a pressure control valve configured to control a pressure of the high pressure gas in response to a distance between the print head and the substrate.

In some embodiments, the atomizing nozzle is configured to atomize the ink into the ink droplets by high pressure atomization.

In some embodiments, the atomizing nozzle is configured to atomize the ink into the ink droplets by ultrasonic atomization.

In some embodiments, the atomizing nozzle further comprises a gas jet unit configured to eject gas such that the gas entrains the atomized ink droplets to move and deposit on the printing region of the substrate.

In some embodiments, the printing apparatus further comprises a flow meter configured to control amount of the ink supplied by the cartridge and entering the print head.

In some embodiments, the amount of the ink is $V=K\times H\times S$, where K is a partial compensation coefficient, H is a thickness of thin film of the ink formed on the printing region of the substrate, and S is an area of the printing region of the substrate.

In some embodiments, the printing apparatus further comprises a distance measuring instrument provided on the print head and configured to measure the distance between the print heat and the substrate, and a distance regulating unit configured to be connected with the distance measuring instrument and the print head, respectively, to regulate the distance between the print head and the substrate in response to the distance measured by the distance measuring instrument.

In some embodiments, the distance between the print head and the substrate is 0.1 mm-10 mm.

In some embodiments, the printing apparatus further comprises a first control unit configured to control the print head to uniformly move in a first direction.

In some embodiments, the first control unit is further configured to control the print head to move by a first predetermined distance in a second direction such that the print head is controlled to move above a printing region having not been deposited with the ink droplets after the print head completes printing in the first direction, wherein the second direction is perpendicular to the first direction.

In some embodiments, the printing apparatus further comprises a second control unit configured to control the substrate on the carrying platform to move by a second predetermined distance in a third direction such that the print head is controlled to move relative to the substrate above a printing region having not been deposited with the ink droplets after the print head completes printing in the first direction, wherein the third direction is perpendicular to the first direction.

The disclosure provides a printing method for depositing ink droplets on a printing region of a substrate, the printing method comprising:

controlling a print head of a printing apparatus to move in a first direction for printing;

after the print head completes printing in the first direction, controlling the print head to move by a predetermined distance in a second direction such that the print head is controlled to move above a printing region having not been deposited with the ink droplets;

repeating the above steps such that the ink droplets are deposited on all of the printing regions of the substrate.

In some embodiments, the second direction is perpendicular to the first direction.

In some embodiments, after the print head completes printing in the first direction, the print head is controlled to move back to an initial position of this time of printing in the first direction, and to move from the initial position by the predetermined distance in the second direction.

In some embodiments, after the print head completes printing in the first direction, the print head is controlled to move by the predetermined distance in the second direction from a completion position of the printing in the first direction.

In some embodiments, the predetermined distance is a printing width.

BRIEF DESCRIPTION OF THE DRAWINGS

In order to explain more clearly the technical solutions of the disclosure, now a brief description of the drawings used therein to describe the embodiments of the disclosure will be made. Obviously, the drawings described in the following description only involve some of the embodiments of the disclosure. Those skilled in the art would obtain, from these drawings, other drawings without creative efforts.

DETAILED DESCRIPTION

Now a clear and complete description of the technical solutions of the disclosure will be made in conjunction with the drawings for the embodiments of the disclosure. Obviously, the described embodiments are part, but not all, of embodiments of the disclosure. All other embodiments obtained without creative efforts based on the embodiments of the disclosure shall belong in the protection scope of the disclosure.

Figure 1:
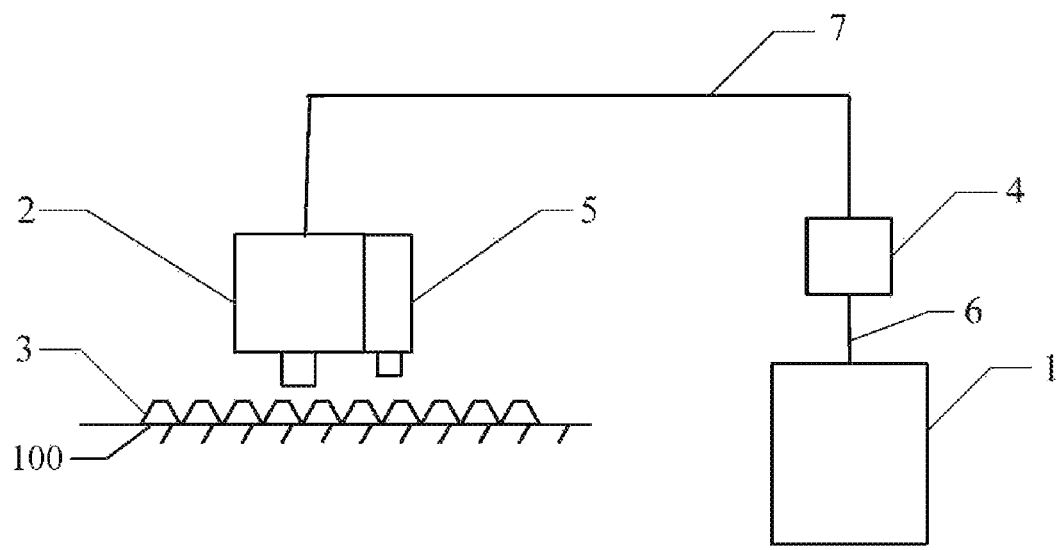
FIG. 1 is a schematic structural view of a printing apparatus according to an embodiment of disclosure.
Figure 2:
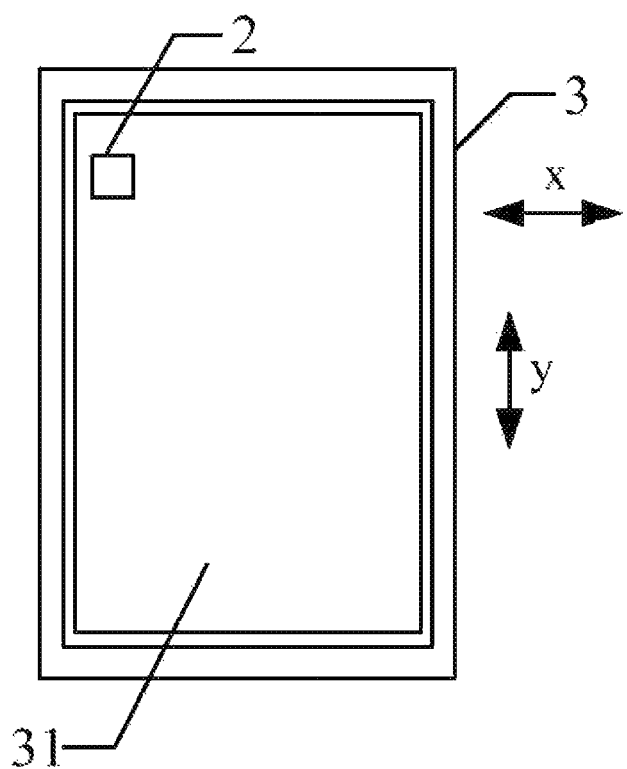
FIG. 2 is a schematic view of a print head of a printing apparatus printing on a substrate according to an embodiment of disclosure.

The embodiments of the disclosure provide a printing apparatus which may be used to print a flatness layer on a substrate for a packaged OLED. As shown in FIGS. 1 and 2, the printing apparatus comprises a carrying platform 100 on which a substrate 3 is placed, a cartridge 1 configured to store and supply ink, and a print head 2 configured to atomize the ink supplied by the cartridge 1 into ink droplets and deposit the ink droplets on a printing region 31 of the substrate 3.

The printing apparatus, by being provided with the print head 2 as configured to atomize ink, atomizes ink into ink droplets, and the ink droplets have a smaller volume, may be filled directly into various small recesses in the substrate, lower the requirement on the profile of the substrate, reduce the time required for leveling, and accomplish leveling with a thinner film.

In an embodiment, the ink droplets have a diameter of 0.5-10 μm. The ink droplets of such a particular diameter may be better and quicker to cover a surface of the substrate 3.

Figure 3:
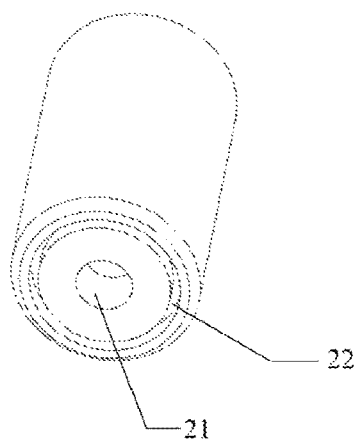
FIG. 3 is a schematic structural view of a print head of a printing apparatus according to an embodiment of disclosure.
Figure 4:
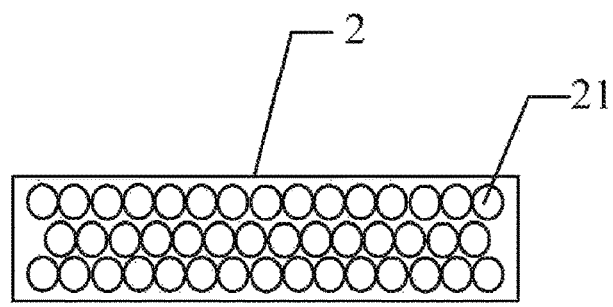
FIG. 4 is a schematic view of an arrangement of a plurality of atomizing nozzles of a printing apparatus according to an embodiment of disclosure.
Figure 5:
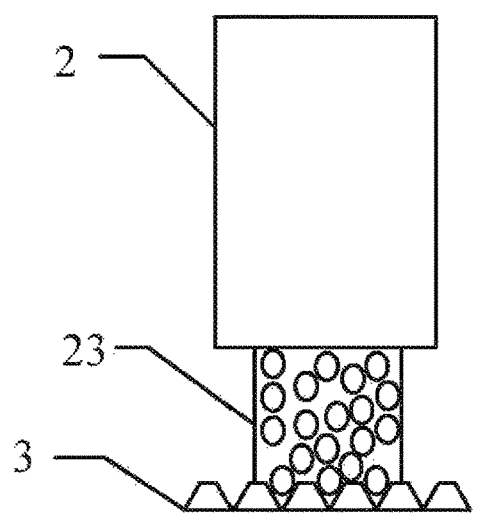
FIG. 5 is a schematic view of a print head of a printing apparatus ejecting ink according to an embodiment of disclosure.

In particular, in order to accomplish the function of atomizing the ink into the ink droplets, as shown in FIG. 3, the print head 2 comprises at least one atomizing nozzle 21 and at least one high pressure gas outlet 22. Here, the atomizing nozzle 21 is configured to atomize the ink into the ink droplets and then eject the ink droplets. When there are a plurality of atomizing nozzles 21, they may be arranged based on the shape and requirement of the printing region 31 of the substrate 3. As shown in FIG. 4, an arrangement of the plurality of atomizing nozzles 21 is illustrated. Increase of the number of the atomizing nozzles may increase the printing speed. The high pressure gas outlet 22 is provided around the atomizing nozzle 21, and configured to evenly eject high pressure gas. As shown in FIG. 5, the high pressure gas forms a wind wall 23 such that the ink droplets are only allowed to drop within the limit as defined by the atomizing nozzle 21 and will not scatter arbitrarily, thereby ensuring that the ink droplets drop within the printing region 31 of the substrate 3.

In order to further control and deposit the ink droplets within the printing region 31 of the substrate 3, the print head 2 further comprises a pressure control valve configured to control a pressure of the high pressure gas in response to a distance between the print head 2 and the substrate 3. By providing the pressure control valve, the pressure of the high pressure gas may be controlled in response to the distance between the print head 2 and the substrate 3, thereby controlling the gas jet speed. The larger the distance is, the larger the gas jet speed is required to be, in order to ensure the ink droplets will not leak outside.

In a preferable embodiment, the atomizing nozzle 21 is configured to atomize the ink into the ink droplets by high pressure atomization. With the high pressure atomization, the kinetic energy of the ink droplets themselves is sufficient to allow the ink droplets to be deposited on the substrate 3.

In another preferable embodiment, the atomizing nozzle is alternatively configured to atomize the ink into the ink droplets by ultrasonic atomization. With the ultrasonic atomization, the ink droplets themselves have a small kinetic energy and a gas flow is needed to entrain the ink droplets to drop onto the substrate 3. Accordingly, such an atomizing nozzle 21 further comprises a gas jet unit which is configured to eject gas such that the gas entrains the atomized ink droplets to move and deposit on the printing region 31 of the substrate 3.

In some embodiments, the printing apparatus further comprises at least one flow meter 4 which is configured to control amount of the ink supplied by the cartridge 1 and entering the print head 2. The flow meter 4 may be communicated with the cartridge through a first conduit 6, and with the print head 2 through a second conduit 7. By providing the flow meter 4, the amount of the ink entering the print head 2 may be controlled, and thus the thickness of a thin film formed by deposition of the ink droplets may be controlled. When the print head 2 has a plurality of atomizing nozzles 21, the number of the flow meter 4 may be 1, which controls the respective atomizing nozzles 21 to use a fixed amount of ink. Alternatively, the flow meters 4 may have the same number as the atomizing nozzles 21 with each of the flow meters 4 controlling the amount of ink of each of the atomizing nozzles 21, thereby improving printing accuracy. In particular, the amount of ink may be obtained by the formula: $V = K \times H \times S$, where V is the amount of ink, K is a partial compensation coefficient, H is a thickness of thin film of the ink formed on the printing region 31 of the substrate 3, and S is an area of the printing region 31. Accordingly, when needing to print, firstly the area S of the printing region 31 to be printed and the thickness of film H are determined, then the total amount of ink may be calculated.

Preferably, the printing apparatus further comprises a distance measuring instrument 5 and a distance regulating unit (not shown). The distance measuring instrument 5 is configured to measure the distance between the print heat 2 and the substrate 3. The distance measuring instrument 5 may be provided on the print head 2 such that the distance between the distance measuring instrument 5 and substrate 3 is equal to the distance between the print heat 2 and the substrate 3, thereby accurately measuring the distance between the print heat 2 and the substrate 3. For example, the distance measuring instrument 5 may be a laser range finder. By providing the distance measuring instrument 5, the distance between the print heat 2 and the substrate 3 may be measured, and may be regulated, as desired after being measured, in order to avoid the print head 2 from being too close to the substrate to cause friction between the print head 2 and the surface of the substrate 3, and meanwhile avoid the print head 2 from being too far away from the substrate to cause the ink droplets to leak outside and drop onto a non-printing region of the substrate 3. The distance regulating unit may be in the form of a motor, a belt and a rail to move the print head 2 by driving the belt with the motor to allow the print head 2 to slide along the rail. It should be appreciated that the distance regulating unit may be alternatively of other specific configurations. In some embodiments, the distance between the print head 2 and the substrate 3 is 0.1 mm-10 mm. Such a particular distance may ensure that the print head 2 will not have friction with the substrate 3 and not allow the ink droplets to leak outside and drop on the non-printing region of the substrate 3.

In some embodiments, the printing apparatus further comprises a first control unit which is configured to control the print head 2 to uniformly move in a first direction. By the first control unit controlling the print head 2 to uniformly move in the first direction, the time for the ink droplets to be deposited on the printing regions 31 of the substrate 3 is same. Since the deposition rate of the ink droplets is unchanged, the thickness of the thin films formed by deposition of the ink droplets on the printing regions 31 of the substrate 3 may be assured to be even.

In addition, the first control unit is further configured to control the print head 2 to move by a first predetermined distance in a second direction such that the print head 2 is controlled to move above a printing region 31 having not been deposited with the ink droplets after the print head 2 completes printing in the first direction, wherein the second direction is perpendicular to the first direction. It should be appreciated that in a specific printing, the print head 2 may be controlled to move back to an initial position of this time of printing in the first direction, followed by moving in the second direction, and then be moved in the first direction for a next time. Alternatively, the print head may be controlled to begin directly from a completion position of this time of the printing in the first direction to move in the second direction and then be moved in the first direction for a next time. For example, as shown in FIG. 2, the substrate 3 is of rectangular, and accordingly, the first direction may be the direction x in which the shorter sides of the substrate 3 are, and the second direction may the direction y in which the longer sides of the substrate 3 are. Preferably, the first predetermined distance is one printing width which generally refers to the size of extent being able to be printed by the print head 2 in static state. Of course, alternatively the distance by which the print head 2 moves in the second direction may be controlled based on the requirement of the practical printing region 31. After completing printing in the first direction, the print head 2 is controlled to move in the second direction such that the print head is controlled to move above a printing region having not been printed. The above processes are repeated such that the ink droplets are deposited on all of the printing regions of the substrate. At the same time, moving in the second direction by the first predetermined distance may ensure the printing accuracy as desired. In particular, moving in the second direction by one printing width may ensure that any of the printing regions 31 will not be left out due to an oversize width of movement and part of regions will not overlap due to an undersized width of movement which otherwise will waste ink.

In addition to the first control unit used to control the movement of the print head 2 in the second direction, in another preferable embodiment, the printing apparatus further comprises a second control unit configured to control the substrate 3 on the carrying platform to move by a second predetermined distance in a third direction such that the print head is controlled to move relative to the substrate 3 above a printing region having not been deposited with the ink droplets after the print head completes printing in the first direction, wherein the third direction is perpendicular to the first direction. It should be appreciated that in a specific printing, the substrate 3 may be controlled to move back to an initial position of this time of printing in the first direction, followed by moving in the second direction, and then be moved in the first direction for a next time. Alternatively, the substrate 3 may be controlled to begin directly from a completion position of this time of printing in the first direction to move in the second direction, and then be moved in the first direction for a next time. For example, as shown in FIG. 2, the substrate 3 is of rectangular, and accordingly, the first direction may be the direction x in which the shorter sides of the substrate 3 are, and the second direction may the direction y in which the longer sides of the substrate 3 are. Preferably, the second predetermined distance is one printing width. Of course, the distance by which the substrate 3 moves in the third direction may be alternatively controlled based on the requirement of a practical printing region 31. Differently from the first control unit directly controlling the print head 2 to move in the second direction, in another embodiment the movement of the substrate 3 in the third direction is controlled by the second control unit and the print head 2 may be indirectly moved above a printing region have not been printed. The above processes are repeated such that the ink droplets are deposited on all of the printing regions of the substrate. At the same time, moving in the third direction by the second predetermined distance may ensure the printing accuracy as desired. In particular, moving in the third direction by one printing width may ensure that any of the printing regions 31 will not be left out due to an oversize width of movement and part of regions will not overlap due to an undersized width of movement which otherwise will waste ink.

In particular, the printing apparatus according to the embodiment of the disclosure may print following the below processes.

The cartridge 1 supplies ink to the print head 2. During this process, the flow meter 4 controls the amount of the ink of the cartridge entering the print head 2 in response to the film thickness as required for the printing regions 31 of the substrate 3. The distance measuring instrument 5 measures the distance between the print head 2 and the substrate 3, and the distance is regulated by the distance regulating unit to be an appropriate size. The atomizing nozzle 21 of the print head 2 atomizes the ink into ink droplets and ejects the ink droplets. At the same time, the high pressure gas outlet 22 of the print head 2 ejects high pressure gas to form a wind wall such that the ink droplets will drop within the printing region 31. In this process, the distance measuring unit 5 may detect the distance between the print head 2 and the substrate 3 in real-time and the distance regulating unit may regulate the distance in real-time. When printing, at first the print head 2 is controlled to uniformly move in the first direction for printing. Next, after the print head 2 completes printing in the first direction, the print head 2 is controlled to move by a predetermined distance in a direction perpendicular to the first direction. Then the print head 2 begins from the position after the movement to print in the first direction. Printing in such a pattern, the print head 2 may move along a trajectory of "Z" until the whole printing regions 31 are all printed. After printing, the ink droplets will flow level and be cured. The finished product is thus obtained.

Figure 6:
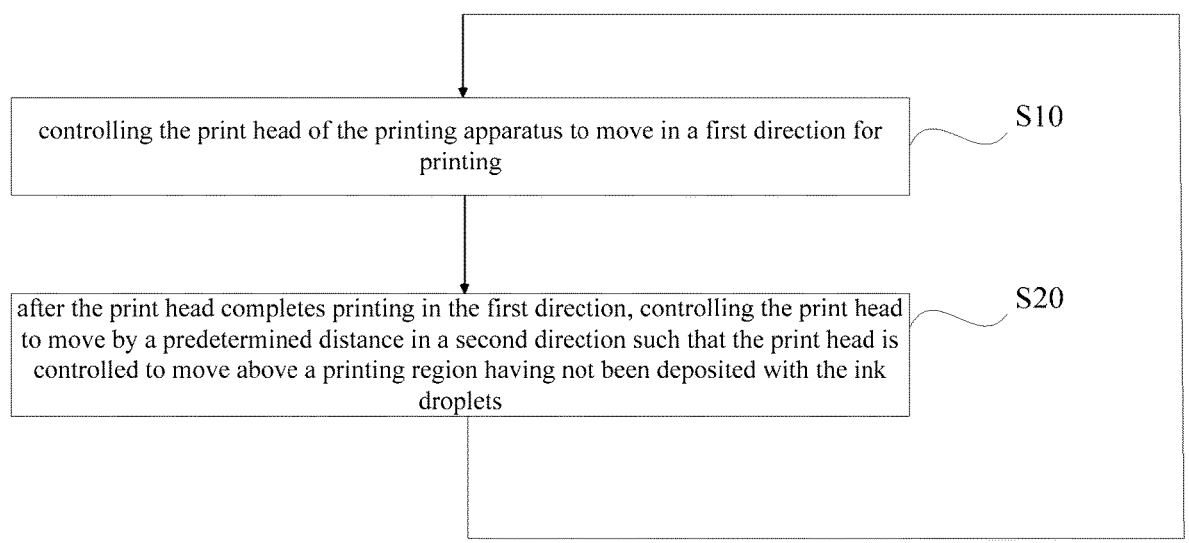
FIG. 6 is a flowchart of a printing method according to an embodiment of disclosure.

Another embodiment of the disclosure provides a printing method for depositing ink droplets on the printing regions of the substrate 3. As shown in FIG. 6, the printing method comprises:

at step S10, the print head 2 of the printing apparatus is controlled to move in a first direction for printing;

at step S20, after the print head 2 completes printing in the first direction, the print head 2 is controlled to move by a first predetermined distance in a second direction such that the print head 2 is controlled to move above a printing region having not been deposited with the ink droplets; and repeating the above steps such that the ink droplets are deposited on all of the printing regions of the substrate 3.

Here, the second direction is perpendicular to the first direction. The first direction may be the direction x in which the shorter sides of the substrate 3 are, and the second direction may the direction y in which the longer sides of the substrate 3 are. Preferably, the predetermined distance is one printing width.

Here, in some embodiments the step S20 may comprise, after the print head 2 completes printing in the first direction, g the print head 2 is controlled to move back to an initial position of this time of printing in the first direction, and to move from the initial position by the predetermined distance in the second direction.

Here, in another embodiment the step S20 may comprise, after the print head 2 completes printing in the first direction, the print head 2 is controlled to move by the predetermined distance in the second direction from a completion position of the printing in the first direction.

As mentioned above, according to the printing apparatus and the printing method of the disclosure, by providing the print head 2 configured to atomize ink, the ink is atomized into ink droplets which may have a smaller volume and be filled directly into various small recesses in the substrate, the requirement on the profile of the substrate is lowered, the time required for leveling is reduced, and leveling may be done with a smaller film thickness. By providing the high pressure gas outlet 22 on the print head 2, a wind wall 23 is formed such that the ink droplets are only allowed to drop within the limit as defined by the atomizing nozzle 21 and will not scatter arbitrarily, thereby ensuring that the ink droplets drop within the printing region 31 of the substrate 3. By providing the distance measuring instrument 5, the distance between the print heat 2 and the substrate 3 may be measured, and may be regulated, if required after being measured, in order to avoid the print head 2 from being too close to the substrate to cause friction between the print head 2 and the surface of the substrate 3, and meanwhile avoid the print head 2 from being too far away from the substrate to cause the ink droplets to leak outside and drop onto a non-printing region of the substrate 3. Moreover, by providing the first and second control units, the movement of the print head 2 and/or the substrate 3 may be controlled such that the ink droplets are deposited on all of the printing regions 31 of the substrate 3, and the printing accuracy is improved.

The embodiments of the disclosure are described in a progressive way. Each embodiment focuses on description of differences from other embodiments. The embodiments may be cross-referred to each other for the same or similar portions thereof.

Although the preferable embodiments of the disclosure have been described, those skilled in the art will make other modifications and variations upon the essential inventive concept. Therefore, the appended claims are intended to be interpreted to encompass the preferable embodiments and all variations and modifications falling within the embodiments of the disclosure.

Finally, it should also be noted that in the context, the relationship terms such as "first" and "second" are only used to distinguish one entity or operation from another entity or operation, and do not necessarily require or imply that these entities or operations have such an actual relationship or sequence therebetween. Furthermore, the terms "comprise", "include", "have" and other variants are intended to cover nonexclusive inclusion such that a process, method, item or terminal apparatus comprising a series of elements comprises not only these elements, but also other elements having not been listed explicitly, or also inherent elements for the process, method, item or terminal apparatus. Without more limitations, an element as defined by the sentence "comprising a" does not exclude there are other like elements in the process, method, item or terminal apparatus comprising the element.

The above description only relates to the embodiments of the disclosure. The protection scope of the disclosure, however, is not limited thereto. Those skilled in the art will readily envisage variations or substitutions within the technical scope as disclosed by the disclosure which should be encompassed in the protection scope of the disclosure. Therefore, the protection scope of the disclosure should be subject to the protection scope as defined by the claims.

What is claimed is:

1. A printing apparatus comprising:
    a carrying platform, configured to carry a substrate,
    a cartridge, configured to store and supply ink, and
    a print head, configured to atomize the ink into ink droplets and deposit the ink droplets on a printing region of the substrate;
    wherein the print head comprises at least one atomizing nozzle and at least one high pressure gas outlet provided around the atomizing nozzle.

2. The printing apparatus according to claim 1, wherein the ink droplets have a diameter of 0.5-10 μm.

3. The printing apparatus according to claim 1, wherein the print head further comprises a pressure control valve configured to control a pressure of high pressure gas in response to a distance between the print head and the substrate.

4. The printing apparatus according to claim 1, wherein the atomizing nozzle is configured to atomize the ink into the ink droplets by high pressure atomization.

5. The printing apparatus according to claim 1, wherein the atomizing nozzle further comprises a gas jet unit configured to eject gas, wherein the gas entrains the atomized ink droplets to move and deposit on the printing region of the substrate.

6. The printing apparatus according to claim 1, wherein the printing apparatus further comprises a flow meter configured to control amount of the ink supplied by the cartridge and entering the print head.

7. The printing apparatus according to claim 6, wherein the amount of the ink is V=K×H×S, where K is a partial compensation coefficient, H is a thickness of a thin film of the ink formed on the printing region of the substrate, and S is an area of the printing region of the substrate.

8. The printing apparatus according to claim 1, further comprising:
- a distance measuring instrument, provided on the print head and configured to measure a distance between the print heat and the substrate, and
- a distance regulating unit, configured to be connected with the distance measuring instrument and the print head, respectively, to regulate the distance between the print head and the substrate in response to the distance measured by the distance measuring instrument.

9. The printing apparatus according to claim 1, wherein a distance between the print head and the substrate is 0.1 mm-10 mm.

10. The printing apparatus according to claim 1, further comprising a first control unit configured to control the print head to uniformly move in a first direction.

11. The printing apparatus according to claim 10, wherein the first control unit is further configured to, after the print head completes printing in the first direction, control the print head to move by a first predetermined distance in a second direction, so that the print head is controlled to move above a printing region having not been deposited with the ink droplets, and wherein the second direction is perpendicular to the first direction.

12. The printing apparatus according to claim 1, wherein the printing apparatus further comprises a second control unit configured to, after the print head completes printing in the first direction, control the substrate on the carrying platform to move by a second predetermined distance in a third direction, so that the print head is controlled to move relative to the substrate above a printing region having not been deposited with the ink droplets, and wherein the third direction is perpendicular to the first direction.

13. A printing method for depositing ink droplets on a printing region of a substrate, the printing method comprising:
- controlling a print head of a printing apparatus to move in a first direction for printing;
- after the print head completes printing in the first direction, controlling the print head to move by a predetermined distance in a second direction such that the print head is controlled to move above a printing region having not been deposited with the ink droplets; and
- repeating the above steps such that the ink droplets are deposited on all of the printing regions of the substrate.

14. The printing method according to claim 13, wherein the second direction is perpendicular to the first direction.

15. The printing method according to claim 14, wherein after the print head completes printing in the first direction, the print head is controlled to move back to an initial position of this time of printing in the first direction, and to move from the initial position by the predetermined distance in the second direction.

16. The printing method according to claim 14, wherein after the print head completes printing in the first direction, the print head is controlled to move by the predetermined distance in the second direction from a completion position of the printing in the first direction.

17. The printing method according to claim 13, wherein the predetermined distance is a printing width.

18. The printing apparatus according to claim 2, wherein the print head comprises at least one atomizing nozzle and at least one high pressure gas outlet provided around the atomizing nozzle.

\* \* \* \* \*